(12) United States Patent
Mathew et al.

(10) Patent No.: US 8,466,517 B2
(45) Date of Patent: *Jun. 18, 2013

(54) CAPACITORLESS DRAM ON BULK SILICON

(75) Inventors: Suraj Mathew, Boise, ID (US); Jigish D. Trivedi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/445,711

(22) Filed: Apr. 12, 2012

(65) Prior Publication Data

US 2012/0199908 A1    Aug. 9, 2012

Related U.S. Application Data

(60) Continuation of application No. 12/897,999, filed on Oct. 5, 2010, now Pat. No. 8,158,471, which is a division of application No. 12/421,950, filed on Apr. 10, 2009, now Pat. No. 7,829,399, which is a continuation of application No. 11/450,661, filed on Jun. 8, 2006, now Pat. No. 7,517,744, which is a division of application No. 11/148,853, filed on Jun. 8, 2005, now Pat. No. 7,538,389.

(51) Int. Cl.
*H01L 27/12*    (2006.01)

(52) U.S. Cl.
USPC .................... 257/347; 257/E21.647; 438/176

(58) Field of Classification Search
USPC ................. 438/176, 190, 195, 213, 222, 269, 438/290; 257/E21.562
See application file for complete search history.

(56) References Cited

U.S. PATENT DOCUMENTS

| 5,414,287 A | 5/1995 | Hong |
| 5,416,350 A | 5/1995 | Watanabe |

(Continued)

FOREIGN PATENT DOCUMENTS

| JP | 62 296458 A | 12/1987 |
| JP | 05-121317 | 5/1993 |

(Continued)

OTHER PUBLICATIONS

Office Action from Korean Patent Application No. 10-2008-7000513, filed May 5, 2006, dated Jul. 27, 2012.

(Continued)

*Primary Examiner* — Cheung Lee
(74) *Attorney, Agent, or Firm* — Knobbe Martens Olson & Bear LLP (57) ABSTRACT

A method of forming capacitorless DRAM over localized silicon-on-insulator comprises the following steps: A silicon substrate is provided, and an array of silicon studs is defined within the silicon substrate. An insulator layer is defined atop at least a portion of the silicon substrate, and between the silicon studs. A silicon-over-insulator layer is defined surrounding the silicon studs atop the insulator layer, and a capacitorless DRAM is formed within and above the silicon-over-insulator layer.

20 Claims, 4 Drawing Sheets

U.S. PATENT DOCUMENTS

| | | |
|---|---|---|
| 5,417,180 A | 5/1995 | Nakamura |
| 5,465,249 A | 11/1995 | Cooper, Jr. et al. |
| 5,510,630 A | 4/1996 | Agarwal et al. |
| 5,897,351 A | 4/1999 | Forbes |
| 5,936,274 A | 8/1999 | Forbes et al. |
| 5,948,162 A | 9/1999 | Nakamura |
| 5,972,758 A | 10/1999 | Liang |
| 5,973,356 A | 10/1999 | Noble et al. |
| 5,991,225 A | 11/1999 | Forbes et al. |
| 6,072,209 A | 6/2000 | Noble et al. |
| 6,097,065 A | 8/2000 | Forbes et al. |
| 6,124,729 A | 9/2000 | Noble et al. |
| 6,143,636 A | 11/2000 | Forbes et al. |
| 6,150,687 A | 11/2000 | Noble et al. |
| 6,153,468 A | 11/2000 | Forbes et al. |
| 6,174,780 B1 | 1/2001 | Robinson |
| 6,238,976 B1 | 5/2001 | Noble et al. |
| 6,245,636 B1 | 6/2001 | Maszara |
| 6,246,083 B1 | 6/2001 | Noble |
| 6,274,913 B1 | 8/2001 | Brigham et al. |
| 6,339,550 B1 | 1/2002 | Wanlass |
| 6,352,864 B1 | 3/2002 | Lee |
| 6,376,286 B1 | 4/2002 | Ju |
| 6,429,074 B2 | 8/2002 | Lee et al. |
| 6,465,846 B1 | 10/2002 | Osanai |
| 6,465,852 B1 | 10/2002 | Ju |
| 6,538,916 B2 | 3/2003 | Ohsawa |
| 6,599,789 B1 | 7/2003 | Abbott et al. |
| 6,617,651 B2 | 9/2003 | Ohsawa |
| 6,661,042 B2 | 12/2003 | Hsu |
| 6,714,436 B1 | 3/2004 | Burnett et al. |
| 6,717,205 B2 | 4/2004 | Gratz |
| 6,881,994 B2 | 4/2005 | Lee et al. |
| 6,946,712 B2 | 9/2005 | Asao |
| 6,956,256 B2 | 10/2005 | Forbes |
| 7,030,436 B2 | 4/2006 | Forbes |
| 7,084,028 B2 | 8/2006 | Fukuzumi |
| 7,432,173 B2 | 10/2008 | Kang et al. |
| 7,829,399 B2 * | 11/2010 | Mathew et al. ............... 438/176 |
| 2002/0038886 A1 | 4/2002 | Mo |
| 2004/0026749 A1 | 2/2004 | Ohsawa |
| 2004/0042256 A1 | 3/2004 | Forbes |
| 2004/0058506 A1 | 3/2004 | Fukuzumi |
| 2005/0138262 A1 | 6/2005 | Forbes |
| 2005/0167751 A1 | 8/2005 | Nakajima et al. |
| 2005/0212033 A1 | 9/2005 | Forbes |

FOREIGN PATENT DOCUMENTS

| | | |
|---|---|---|
| JP | 2000 269460 A | 9/2000 |
| JP | 2004-071935 | 8/2002 |
| JP | 2002-260381 | 9/2002 |
| JP | 2003-209228 | 7/2003 |
| JP | 2005-142451 | 6/2005 |
| TW | 230455 | 4/2005 |
| WO | WO 95/15562 | 6/1995 |

OTHER PUBLICATIONS

Ararwal et al., "SiC Electronics," *International Electron Devices Meeting Technical Digest*, 1996, p. 225.

Denton et al., "Fully depleted dual-gated thin-film SOI P-MOSFET's fabricated in SOI islands with an isolated buried polysilicon backgate," *IEEE Electron Device Letters*, Nov. 1996, pp. 509-511, vol. 17, No. 11.

Dimitrijev et al., "Charge retention in metal-oxide-semiconductor capacitors on SiC used as nonvolatile-memory elements," *Applied Physics Letters*, vol. 80, No. 18, pp. 3421-3423, May 6, 2002.

Fazan et al., "A simple 1-transistor capacitor-less memory cell for high performance embedded DRAMs," Proceedings of the IEEE Custom Integrated Circuits Conference 2002, pp. 99-102.

Fazan et al., "Capacitor-less 1-transistor DRAM," IEEE International SOI Conference, 2002, pp. 10-13.

Kallender, P., "Swiss team develops single-transistor SOI DRAM cell," http://www.eeitmes.com/story/OEG20011016S0099, Oct. 16, 2001.

Ohsawa et al., "A Memory Using One-Transistor Gain Cell on SOI (FBC) with Performance Suitable for Embedded DRAM's" Symposium on VLSI Circuits, Jun. 12-14, 2003, pp. 93-96.

Ohsawa et al., "Memory Design Using a One-Transistor Gain Cell on SOI," *IEEE Journal of Solid-State Circuits*, vol. 37, No. 11, pp. 1510-1522, Nov. 2002.

Ohsawa et al., "Memory Design Using One-Transistor Gain Cell on SOI," IEEE Int. Solid State Circuits Conference, San Francisco, 2002, pp. 152-153.

Yoshida et al., "A design of a capacitorless 1T-DRAM cell using gate-induced drain leakage (GIDL) current for low-power and high-speed embedded memory," *Technical Digest—International Electron Devices Meeting 2003*, 2003, IEEE Cat. No. 03CH3747, pp. 913-916.

International Search Report for International Application No. PCT/US2006/017493 dated May 12, 2007.

Office Action for European Patent Application No. 06 752 344.9-2203 dated Nov. 23, 2010 by European Patent Office.

Office Action for Chinese Patent Application No. 2006800203457 dated Sep. 4, 2009 by China State Intellectual Property Office.

Office Action for Taiwanese Patent Application No. 095117389 dated May 11, 2009 by Intellectual Property Office (IPO).

Office Action for Taiwanese Patent Application No. 095117389 dated Feb. 4, 2010 by Intellectual Property Office (IPO).

Notice of Rejection dated Aug. 9, 2011 for Japanese Patent Application No. 2008-515707.

Search and Examination Report dated Aug. 19, 2011 for Singapore Patent Application No. 200718354-4.

Office Action in Japanese Application No. 2008-515707, mailed Jan. 24, 2012.

Supplemental Notice of Allowability in U.S. Appl. No. 12/897,999 dated Mar. 6, 2012.

* cited by examiner

CAPACITORLESS DRAM ON BULK SILICON

REFERENCE TO RELATED APPLICATION

This application is a continuation of U.S. patent application Ser. No. 12/897,999, filed on Oct. 5, 2010, issued Apr. 17, 2012 as U.S. Pat. No. 8,158,471, which is a divisional of U.S. patent application Ser. No. 12/421,950, filed on Apr. 10, 2009, issued Nov. 9, 2010 as U.S. Pat. No. 7,829,399, which is a continuation of U.S. patent application Ser. No. 11/450,661, filed on Jun. 8, 2006, issued Apr. 14, 2009 as U.S. Pat. No. 7,517,744, which is a divisional of U.S. patent application Ser. No. 11/148,853, filed on Jun. 8, 2005, issued May 26, 2009 as U.S. Pat. No. 7,538,389, the entire disclosures of which are hereby incorporated herein by reference.

FIELD OF THE INVENTION

This invention relates generally to a localized silicon-on-insulator ("SOI") semiconductor design, and, more particularly, to the creation of localized oxide in the array of dynamic random access memories ("DRAM").

BACKGROUND OF THE INVENTION

Use of a silicon-on-insulator, or SOI, substrate generally enables the manufacture of typical circuit elements over an insulator, such as oxide. In one application, capacitorless DRAMs may be formed on SOI. Use of the SOI design versus a traditional silicon substrate increases the floating body effect for the access transistors of these capacitorless DRAMs, yielding far more effective storage. The programming of the floating bodies in such DRAMs may be done either by impact ionization ("II") or by gate induced drain leakage ("GIDL"). The sensing is non-destructive and is done using a resistance or current sensing method at a lower voltage. Further description of capacitorless DRAM via GIDL may be found in Yoshida et al., *A Design of a Capacitorless IT-DRAM Cell Using Gate-induced Drain Leakage (GIDL) Current for Low-power and High-speed Embedded Memory*, Technical Digest—International Electron Devices Meeting 2003, pp. 913-916 (IEEE Cat. No. 03CH37457, 2003), the contents of which are incorporated herein in its entirety.

SUMMARY OF THE INVENTION

According to one embodiment of the invention, a method of forming capacitorless DRAM over localized silicon-on-insulator is disclosed. The method comprises the following steps: A silicon substrate is provided, and an array of silicon studs is defined within the silicon substrate. An insulator layer is defined atop at least a portion of the silicon substrate, and between the silicon studs. A silicon-over-insulator layer is defined surrounding the silicon studs atop the insulator layer, and a capacitorless DRAM is formed within and above the silicon-over-insulator layer.

According to another embodiment of the invention, a method of forming a memory chip is disclosed. The method comprises the following steps: A periphery region and a memory array region are defined on the memory chip. At least one silicon-over-insulator region is formed in the memory array region, without forming a silicon-over-insulator region in the periphery region. At least one capacitorless DRAM is formed on and within the at least one silicon-over-insulator region.

According to another embodiment of the invention, a memory device is disclosed. The memory device comprises a source and a drain. The memory device further comprises a floating body formed between the source and the drain, the floating body defined within a localized silicon-over-insulator. The memory device further comprises a gate adjacent the floating body.

According to another embodiment of the invention, an integrated circuit is disclosed. The integrated circuit comprises a periphery region, and an array region. At least one localized silicon-over-insulator is formed within the array region. The integrated circuit further comprises a source and a drain formed within the array region. A floating body is formed between the source and the drain within the at least one localized silicon-over-insulator. The integrated circuit further comprises a gate adjacent the floating body.

According to another embodiment of the invention, a system is disclosed. The system comprises a source, and a first drain and a second drain. The system further comprises a first floating body formed between the source and the first drain, and a second floating body formed between the source and the second drain, the floating bodies defined within a localized silicon-over-insulator. The system further comprises a first gate adjacent the first floating body, and a second gate adjacent the second floating body.

According to one embodiment of the invention, a method of operating a capacitorless DRAM is disclosed. The method comprises the following steps: A floating body is placed in a first state, and the first state is detected by measuring a first current at a source of the capacitorless DRAM. The floating body is defined within a localized silicon-over-insulator.

DETAILED DESCRIPTION OF THE PREFERRED EMBODIMENT

While the preferred embodiments of the present invention illustrate localized SOI in combination with capacitorless DRAM, it should be understood that these methods of forming localized SOI may be incorporated into the fabrication of other integrated circuits as well. In addition, while the following methods are described in terms of particular DRAM fabrication techniques, as would be well known to those of skill in the art, such techniques may be replaced by other methods of fabricating and modifying semiconductor materials.

SOI is typically created by a uniform layer transfer. Thus, in order to manufacture capacitorless DRAM over SOI, for example, the entire surface of the array and periphery of the memory device incorporates a SOI substrate. However, while the SOI is desirable within the array, where the insulator enhances floating body effects, it adversely affects performance of the chip in the periphery.

Moreover, the creation of SOI via layer transfer is a difficult, time-consuming and expensive process. The fusion of different silicon and insulative layers poses many technical problems and must be performed at particular temperatures under particular conditions.

Therefore, there is a need in the art to create localized areas of SOI by conventional semiconductor fabrication techniques while leaving the rest of the chip unmodified. There is a further need for a method of making capacitorless DRAM using bulk silicon by conventional DRAM fabrication techniques. Thus, the advantages of capacitorless DRAM might be achieved without the expense and difficulty of creating SOI via layer transfer.

FIGS. 1 through 5 illustrate one method for forming localized SOI inexpensively and efficiently. According to this method, the SOI structure(s) may be formed solely within the array of a memory chip, leaving the periphery to be formed on and within a typical semiconductor substrate.

Although not shown in any figure, the following method of forming localized SOI may be performed using any typical substrate 10, often formed from a silicon wafer. In other embodiments, the substrate 10 may comprise other suitable materials (e.g., other group III-IV materials), or epitaxial layers formed over single crystal wafers.

Figure 1:
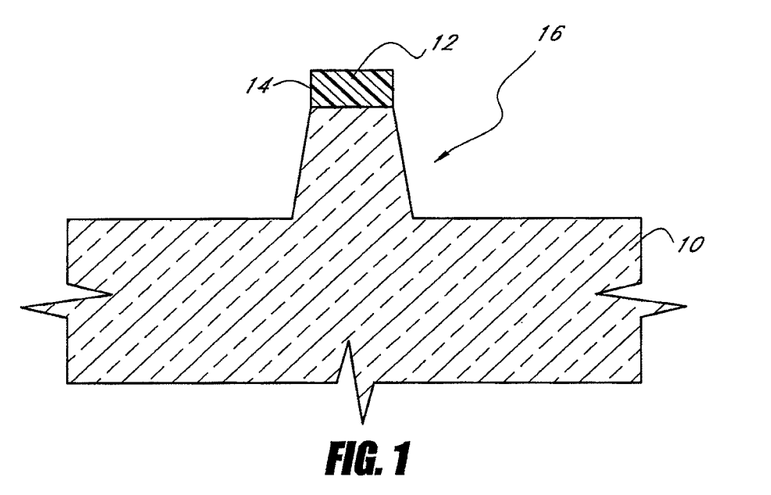
FIG. 1 is a schematic cross-sectional view of a portion of a memory device on which a first step of a process for forming localized SOI according to one embodiment of the present invention has been performed.

With reference initially to FIG. 1, a thin, thermally-grown dielectric layer (not shown), comprising pad oxide in a preferred embodiment, is preferably first formed over the substrate 10. A hard mask layer 12, such as silicon nitride, may then be deposited over the substrate 10 and dielectric layer. The hard mask layer 12 may be formed by any well-known deposition process, such as sputtering, chemical vapor deposition (CVD) or spin-on deposition, among others. Although the hard mask layer 12 comprises silicon nitride in a preferred embodiment, it must be understood that it may also be formed from silicon oxide, for example, or other materials that can protect underlying substrate during a substrate etch and also withstand additional processing, as will be apparent from the fabrication steps described further below.

In a step also not illustrated in the figures, the hard mask layer 12 may then be patterned using a photoresist layer formed over the hard mask layer 12. The photoresist layer may be patterned to form a mask using conventional photolithographic techniques, and the hard mask layer 12 may be anisotropically etched through the patterned photoresist to obtain a plurality of hard mask islands 14 within the array region of the memory device. The photoresist layer may then be removed by conventional techniques, such as by using an oxygen-based plasma. In alternative embodiments, the hard mask layer 12 may be anisotropically etched to obtain a hard mask grid, which can generally provide similar functionality (namely, protecting portions of the substrate 10 that will serve to seed lateral epitaxial overgrowth) as the hard mask islands 14 discussed at length below.

As shown in FIG. 1, which illustrates a cross-sectional view of a portion of the array, the silicon of the substrate 10 is then selectively etched back. The etch process selectively etches the substrate 10 relative to the material forming the hard mask layer 12. For example, a selective wet etch may be used that strips silicon relative to silicon nitride. In another embodiment, ion milling or reactive ion etching may be used. Thus, the array of the memory device becomes an array of silicon studs 16, preferably with one centered on each active area region. Each of these silicon studs 16 is defined beneath the hard mask islands 14. Meanwhile, at least a portion of the periphery of the memory device is preferably left untouched, protected by unpatterned regions of the hard mask 12.

In an alternative embodiment, only one silicon stud 16 need be formed for a plurality of active areas. For example, one silicon stud 16 may be formed for every five active areas. However, in such an embodiment, some of the steps below, such as the lateral epitaxial growth of silicon shown in FIG. 3, may take much longer. As will be understood by the skilled artisan, steps not shown in the figures are typically performed to separate the active areas. For example, in one embodiment, a field oxide could be defined surrounding each active area to prevent interference between adjacent active areas. Separate field isolation steps, on the other hand, may be omitted where localized or pseudo-SOI is formed individually for each active area, as illustrated.

Figure 2:
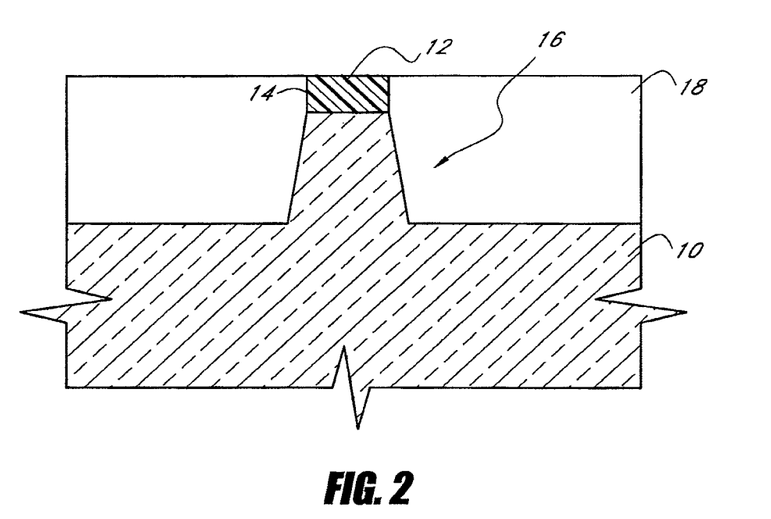
FIG. 2 illustrates the memory device of FIG. 1 on which a second step of a process for forming localized SOI according to one embodiment of the present invention has been performed.

In FIG. 2, the portions of the array stripped according to the steps above are shown filled by an insulator layer 18, preferably an oxide. In a preferred embodiment, the insulator layer 18 is blanket deposited over the array at least up to the height of the top surface of the silicon studs 16. After deposition of a sufficient amount of insulator, the excess that may have formed over the islands 14 and other portions of the device may be removed by any of a number of processes well-known to those of skill in the art. For example, the surface of the device may be planarized to the top surface of the hard mask islands 14, as shown in FIG. 2. Any suitable planarization process, such as, for example, chemical mechanical polishing ("CMP"), may be used.

Thus, the array preferably comprises a plurality of silicon studs 16 surrounded by insulator 18, whereas the periphery will simply remain in its original configuration with a hard mask layer 12 overlying the dielectric layer (e.g., pad oxide, not shown) covering the substrate 10.

Figure 3:
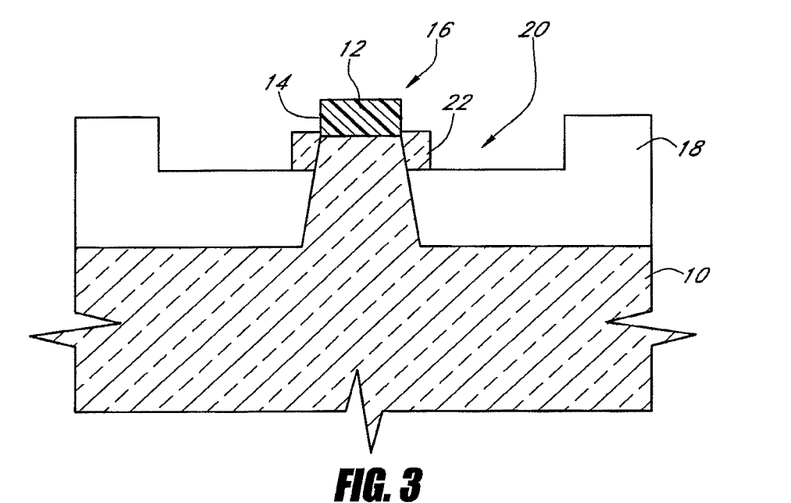
FIG. 3 illustrates the memory device of FIG. 1 on which a third step of a process for forming localized SOI according to one embodiment of the present invention has been performed.

Turning to FIG. 3, another masking process, such as that described above, may be used within the array to open the insulator layer 18 around the silicon studs 16, at least in the regions where active areas are desired. In the illustrated embodiment, each active area has its own trench 20, such that unetched portions of the insulator 18 between trenches 20 serve as field isolation. As described above, this process is preferably performed using photoresist patterned according to conventional photolithographic techniques, optionally with a hard mask. In a preferred embodiment, a selective etching process may then be used to selectively recess the insulator layer 18 relative to the hard mask layer 12 and substrate 10, thereby forming trenches 20 in the memory device surrounding the silicon studs 16. This etching process is preferably continued until the trench 20 within the insulator layer 18 achieves a depth greater than the height of the hard mask layer 12 but less than the height of the silicon studs 16, thereby exposing a portion of the silicon substrate 10 forming silicon studs 16. Preferably, the trench 20 has a depth between about 200 Å and 1,000 Å.

In a preferred embodiment, a few layers of silicon 22 may then be epitaxially grown from the silicon stud 16, using the silicon as a seed layer. As is well-known to those of skill in the art, the epitaxial growth produces silicon extensions 22 with the same crystalline structure as the silicon substrate 10. Preferably, selective epitaxy is employed to avoid the need for subsequent removal of polysilicon from the exposed oxide and nitride surfaces. Preferably between about 50 Å and 500 Å of silicon (or other semiconductor) is grown.

Figure 4:
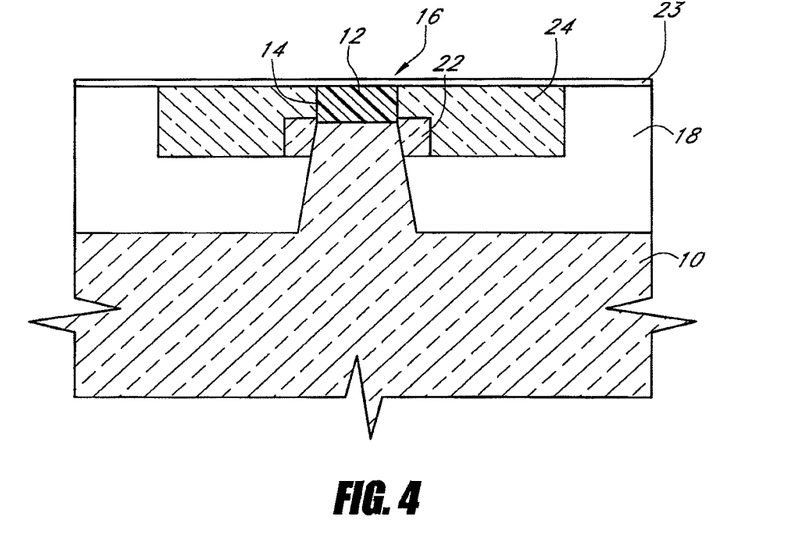
FIG. 4 illustrates the memory device of FIG. 1 on which a fourth step of a process for forming localized SOI according to one embodiment of the present invention has been performed.

As shown in FIG. 4, a layer of amorphous silicon 24 may then be deposited within the trench 20 formed around the silicon stud 16. In a preferred embodiment, the amorphous silicon 24 may be blanket deposited over the array, filling the trenches 20. After deposition of a sufficient amount of silicon, the excess may be removed by any of a number of processes well-known to those of skill in the art. As shown in FIG. 4, the surface of the device is preferably planarized to the top surface of the hard mask islands 14. Any suitable planarization process, such as, for example, CMP, may be used. In another embodiment, the silicon extensions 22 may instead be extended by epitaxial deposition in order to fill the trenches 20. In still another arrangement, planarization may follow the crystallization step described below.

In a preferred embodiment, a thin oxide 23, shown in FIG. 4, may then be grown over the surface of the silicon layer 24, which may further facilitate the crystallization of the filler silicon 24 using the epitaxially deposited silicon extension 22 as a seed layer.

The preferred silicon and oxide deposition is followed by an annealing process, whereby the amorphous silicon 24 has a tendency to take on a crystalline orientation similar to that of the epitaxially grown silicon extensions 22. Preferably, the amorphous silicon 24 takes an ordered crystalline pattern. Such conversion is a species of solid phase epitaxy (SPE) known as epitaxial lateral overgrowth (ELO).

Figure 5:
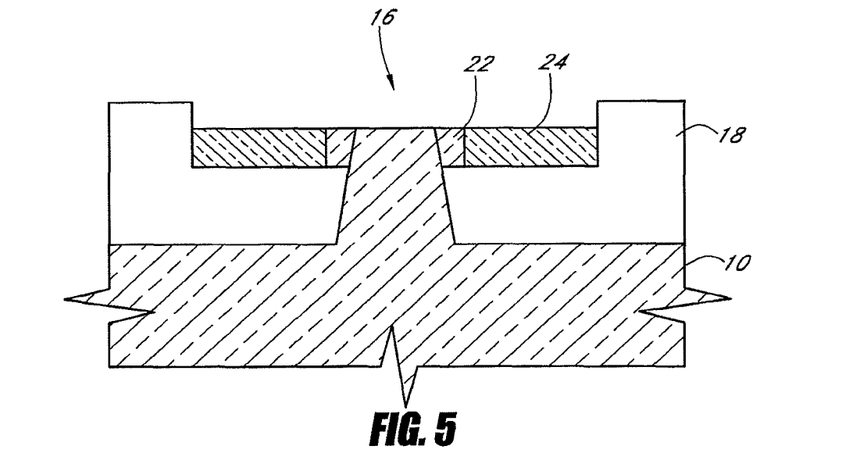
FIG. 5 illustrates the memory device of FIG. 1 on which a fifth step of a process for forming localized SOI according to one embodiment of the present invention has been performed.

Finally, as shown in FIG. 5, the hard mask islands 14 may be removed, and the silicon layer 24 (preferably now crystallized) may be recessed. In a preferred embodiment, a selective etch may be used that etches the silicon 24 and the hard mask layer 14 far more effectively than the insulator layer 18, thereby exposing the silicon stud 16 for further processing steps. Further selective epitaxial deposition can then be conducted to achieve the desired thickness. Alternatively, the whole wafer can be planarized.

Figure 6:
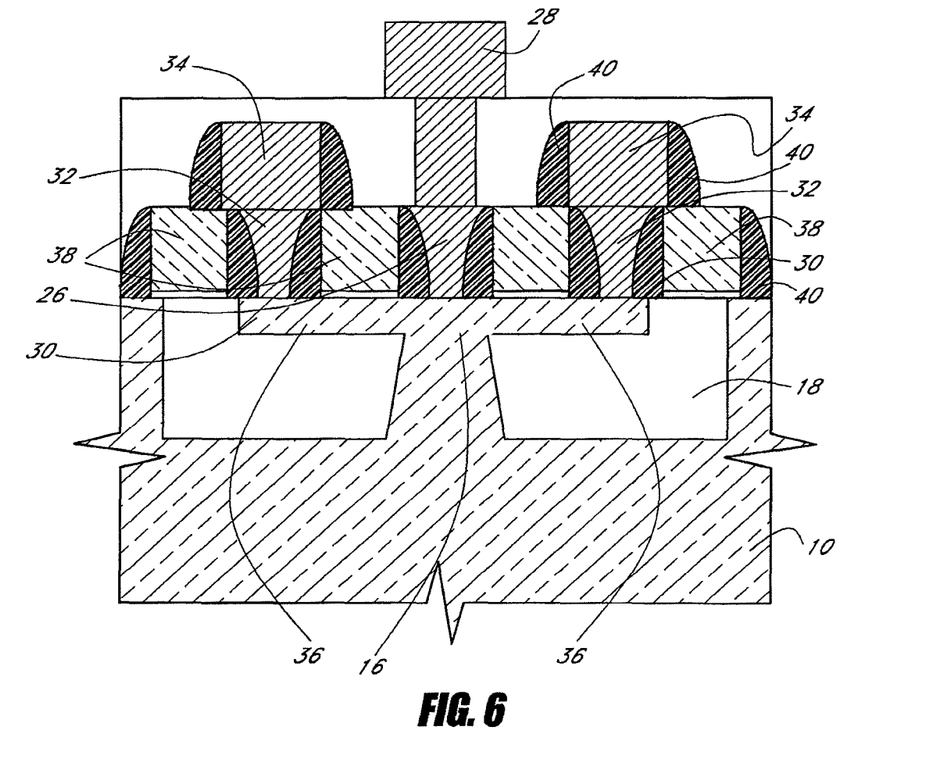
FIG. 6 illustrates a capacitorless DRAM built over the localized SOI substrate of FIG. 5.
Figure 7:
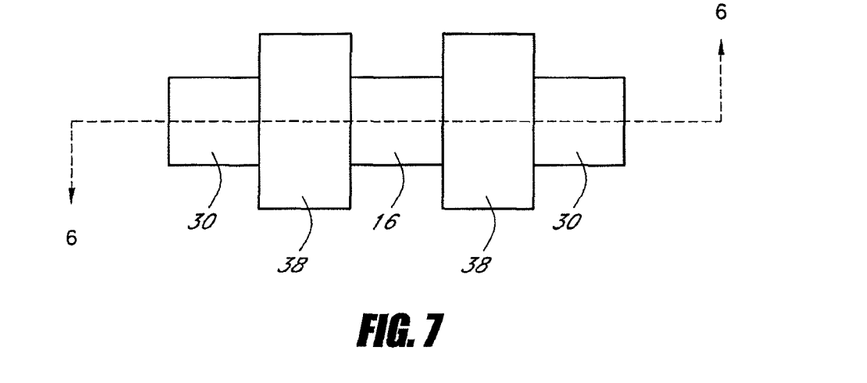
FIG. 7 is a partial top-down plan view of the capacitorless DRAM of FIG. 6.

According to the above-described process, a localized silicon-over-insulator may be formed using relatively inexpensive fabrication techniques on a conventional polysilicon substrate. FIGS. 6 and 7 show an arrangement where two memory cells share a single transistor source. In particular, these figures illustrate capacitorless DRAM formed on and within this SOI substrate. Of course, in other embodiments, other DRAM schemes are also contemplated In FIG. 6, a completed capacitorless DRAM structure is shown formed over localized SOI created according to the steps set forth above. As illustrated, the silicon stud 16 remains beneath the common source and is connected by contacts 26 to a conductive digit or bit line 28. The drains 30 are located at the farthest ends of the crystallized silicon layer 24 and are also electrically connected by contacts 32 with sense lines 34. Floating bodies 36 form part of the channels that separate the drains 30 and the source (at the top of the pillar 16) in the preferred embodiment, and these floating bodies 36 are directly adjacent an inner pair of word lines 38. This inner pair of word lines 38 preferably separates the source 16 and the drains 30, as may be seen in FIG. 6, serving as dual gates. While referred to hereinabove as drains 30 and source 16, it will be understood that these are mere labels used for convenience and for ready comparison to traditional capacitor-based DRAM designs. The labels can be reversed; whether the voltage is at a higher level at the source or the drain depends upon whether a read or a write operation is being performed, as described in more detail below.

The structure shown in FIG. 6 may be formed according to a number of deposition, pattern and etch steps well known to those of skill in the art. While configured for capacitorless DRAM operation, the illustrated scheme, whereby two memory cells share a common bit line 28 and bit line contact 26, is otherwise similar to the scheme in U.S. Pat. No. 6,660,584, issued to Tran, the disclosure of which is incorporated herein by reference in its entirety. The '584 patent describes a "$6F^2$" arrangement in which pairs of memory cells share a common bit line and source region with independent pairs of word lines, drains and capacitors. The process used to form the structure shown in FIG. 6 will differ, of course, from that in U.S. Pat. No. 6,660,584 to the extent that the structure of FIG. 6 lacks capacitors.

Preferably, a gate oxide is first grown over the silicon layer, followed by a gate stack deposition and etching. The necessary doping implants may then be formed to define the source, drain and channel regions. Spacers 40 may be deposited and etched, in a typical spacer fabrication process well known to those of skill in the art, before some of the doping steps. The bit line and cell side junctions are then formed, followed by formation of the metallic contacts and bit lines. Sense regions and other metallic contacts may then also be formed. Such processes may be carried out in a number of ways, but the capacitorless DRAM thus formed is particularly effective as a result of its formation over localized SOL As a result of the SOL the floating bodies 36 function particularly well, isolated as they are within the insulator layer 18, and the devices of the periphery surrounding the array can be tied to the bulk substrate 10.

In a preferred embodiment, the capacitorless DRAM shown in FIG. 6 operates using gate-induced drain leakage (GIDL) current, although in other embodiments impact ionization current may also be used. As would be well understood by those skilled in the art, capacitorless DRAM uses the floating bodies 36 to store information regarding the state of the transistor. In particular, in order to write a logical "1" value to the transistor shown in FIG. 6, a "drain" 30 is placed at an elevated voltage relative to an adjacent gate (i.e., one of the word lines 38). The voltages of the drain 30 and gate 38 are controlled by the sense lines 34 and the word lines 38 respectively. As a result of electron tunneling, electrons flow to the drain 30, while generated holes flow to the floating bodies 36 underlying the gates.

As the holes accumulate in a floating body 36, the threshold voltage of the transistor is reduced, and the source current is thereby increased. Thus, a digital oscilloscope may be used, typically during the design of the capacitorless DRAM, to measure the source current and thereby the state of the transistor. In the illustrated embodiment, this source current may be detected along the raised bit line 28. In order to write a logical "0" value to one of the transistors, the adjacent gate takes an elevated voltage relative to the drain 30. Thus, the holes in the floating body 36 are forced out, the threshold voltage increases again, and the source current is reduced. Again, a digital oscilloscope may be used to detect this change in source current in determining appropriate operational thresholds. More information regarding how such capacitorless DRAM functions may be found in the article cited and incorporated above written by Eijiag Yoshida and Tetsu Tanaka.

As illustrated, each active area of the capacitorless DRAM forms part of a pair of memory cells comprising two floating bodies 36, and a transistor having a single source 16 shared by the memory cells, two gates and two drains 30. The pair of memory cells, therefore, has two addressable locations, the floating bodies 36, that can each store one bit of data. This preferred embodiment functions generally as described above. However, in one application, the pair of memory cells may provide redundancy because, if either of the floating bodies 36 is storing a "1" bit, the source current at the bit line 28 is elevated. Thus, in one embodiment, the read and write operations using the illustrated pair of memory cells will take place simultaneously to both floating bodies 36, thereby reducing errors.

Alternatively, the pair of memory cells may have three possible states. In one state, both floating bodies 36 store a "0" bit, and the source current through the conductive line 28 is at its lowest level. In a second state, one and only one of the floating bodies 36 stores a "1" bit, and the source current through the bit line 28 is at a higher level. Note that in this second state, the elevated source current through the bit line 28 yields only the information that one of the floating bodies 36 is storing a "1" bit, and does not indicate which of the floating bodies 36 is in this elevated state. In a third state, both of the floating bodies 36 store a "1" bit, and the source current through the bit line 28 is at its highest level. Thus, a sensitive oscilloscope, for example, will be able to differentiate between these three states.

A schematic plan view of this capacitorless DRAM is shown in FIG. 7. Of course, this capacitorless DRAM design is shown by way of example only, and the localized SOI method described above with reference to FIGS. 1-5 may be used in any number of semiconductor environments.

While certain embodiments of the inventions have been described, these embodiments have been presented by way of example only, and are not intended to limit the scope of the invention. Indeed, the novel methods and devices described herein may be embodied in a variety of other forms; furthermore, various omissions, substitutions and changes in the form of the methods and devices described herein may be made without departing from the spirit of the invention. The accompanying claims and their equivalents are intended to cover such forms or modifications as would fall within the scope and spirit of the invention.

We claim:

1. A system, comprising:
   a silicon substrate;
   an array of silicon studs within the silicon substrate;
   an insulator layer positioned over a portion of the silicon substrate, and between the silicon studs;
   a plurality of silicon-over-insulator layers positioned over the insulator layer, each of the silicon-over-insulator layers surrounding a corresponding one of the silicon studs such that each of the silicon studs extends through the insulator layer from the silicon substrate to the corresponding silicon-over-insulator layer; and
   a plurality of capacitorless DRAM cells, each of the capacitorless DRAM cells formed within and above a corresponding one of the silicon-over-insulator layers.

2. The system of claim 1, further comprising a common source shared by a pair of memory cells, the memory cells further comprising two floating bodies, two gates and two drains.

3. The system of claim 2, wherein the two floating bodies are formed within each silicon-over-insulator layer.

4. The system of claim 1, further comprising a periphery region and a memory array region, wherein the silicon-over-insulator layers are formed in the memory array region without being formed in at least a portion of the periphery region.

5. A system, comprising:
   a silicon substrate;
   an insulator layer atop a portion of the silicon substrate;
   a silicon-over-insulator structure atop at least a portion of the silicon substrate;
   a silicon stud surrounded by the silicon-over-insulator structure such that the silicon stud extends through the insulator layer from the silicon substrate to the silicon-over-insulator structure; and
   a capacitorless DRAM within and above the silicon-over-insulator structure.

6. The system of claim 5, further comprising a periphery region and a memory array region, wherein the silicon-over-insulator structure is formed in the memory array region without being formed in at least a portion of the periphery region.

7. The system of claim 5, further comprising two floating bodies within the silicon-over-insulator structure, wherein the two floating bodies share a common source.

8. A memory chip, comprising:
   a periphery region;
   a memory array region;
   a silicon substrate;
   at least one localized silicon-over-insulator region formed in the memory array region without being formed in at least a portion of the periphery region;
   an insulator layer beneath the silicon-over-insulator region;
   a silicon pillar surrounded by the insulator layer and extending from the silicon substrate to the silicon-over-insulator region through the insulator layer; and
   at least one capacitorless DRAM cell on and within the at least one localized silicon-over-insulator region.

9. The memory chip of claim 8, further comprising at least one floating body defined within the at least one silicon-over-insulator region.

10. The memory chip of claim 9, further comprising:
    a source defined at the top of the silicon pillar for the floating body;
    a drain, wherein the floating body separates the source from the drain; and
    a bit line connected to the source.

11. The memory chip of claim 9, wherein the at least one floating body comprises at least two floating bodies, further comprising a single, shared source in the memory array region for every two floating bodies.

12. The memory chip of claim 11, wherein the source is configured to conduct a current having values indicative of three states, the three states comprising:
    a first state, in which the first and second floating bodies store a "0" bit;
    a second state, in which one of the first and second floating bodies stores a "0" bit, and the other of the first and second floating bodies stores a "1" bit; and
    a third state, in which the first and second floating bodies store a "1" bit, and wherein the second and third states are not differentiated upon detection of the current.

13. The memory chip of claim 12, wherein the first floating body is configured to attain the first state when a first drain is placed at a first elevated voltage relative to a first gate.

14. The memory chip of claim 13, wherein the first floating body is configured to attain the second state when the first gate is placed at a second elevated voltage relative to the first drain.

15. The memory chip of claim 14, wherein the first state causes an increased source current at the source, and the second state causes a decreased source current at the source.

16. The memory chip of claim 11, wherein the first and second floating bodies are redundant.

17. The memory chip of claim 16, wherein the source is configured to conduct a current having values indicative of three states, the three states comprising:

a first state, in which the first and second floating bodies store a "0" bit;

a second state, in which one of the first and second floating bodies stores a "0" bit, and the other of the first and second floating bodies stores a "1" bit; and a third state, in which the first and second floating bodies store a "1" bit, and wherein the second and third states are not differentiated upon detection of the current.

18. The memory chip of claim 17, wherein the first floating body is configured to attain the first state when a first drain is placed at a first elevated voltage relative to a first gate.

19. The memory chip of claim 18, wherein the first floating body is configured to attain the second state when the first gate is placed at a second elevated voltage relative to the first drain.

20. The memory chip of claim 19, wherein the first state causes an increased source current at the source, and the second state causes a decreased source current at the source.

* * * * *